RE 25595

Jan. 16, 1962 H. SCHWAB ET AL 3,017,232

PRINTED CIRCUIT BOARD FILE

Filed Dec. 27, 1960

INVENTORS.
HELMUT SCHWAB
TAGE O. ANDERSON
STANLEY E. BEALE

BY Christie, Parker & Hale
ATTORNEYS

3,017,232
PRINTED CIRCUIT BOARD FILE

Helmut Schwab, Pacific Palisades, Tage O. Anderson, Arcadia, and Stanley E. Beale, Bradbury, Calif., assignors to Applied Development Corporation, Hawthorne, Calif., a corporation of California Filed Dec. 27, 1960, Ser. No. 78,730
10 Claims. (Cl. 312—223)

This invention relates to apparatus for filing printed circuit boards or cards and more particularly to modular hardware that may be readily snapped together for assembling a circuit board receptacle and thereby allow circuit boards to be readily placed into and out of circuit relationship therewith.

With the development of data processing installations, large, complex systems have been a result. These data processing systems have often been constructed of a bewildering and often inconsistent array of equipment. The design of these systems has evolved in terms of circuit modules to simplify the manufacture, assembly, and maintenance thereof. A large number of the circuit modules have been used in the form of pluggable printed circuit boards or cards whereby a faulty circuit or modification in circuit design may be readily realized by withdrawing a circuit card and replacing it with a new one. The new card necessarily has the same physical dimensions as the one it replaces and generally includes an electrical connector mounted with each card. Therefore, the design of hardware to house the circuits, including the printed circuit cards, has been an important factor in the overall design of an efficient, economical data processing system. Consistent with modular construction techniques, the printed circuit cards have been stored and filed in drawers that allow ready access to any group of printed circuit cards. As contrasted with the earlier types of pluggable circuitry, this type of an assembly did not include an electrical connector with each printed circuit card but, instead, the connector was an integral part of the drawer. This type of construction required that the printed circuit board may be readily and easily inserted into the stationary electrical connector. This necessarily implies the correct alignment between the elements for guiding the circuit board into correct electrical relationship with its connector. These circuit drawers and their associated electrical connectors have been manufactured by means of sheetmetal techniques wherein each of the components thereof are separately manufactured and, therefore, must be accurately aligned upon assembly. The alignment problems are serious since a slight misalignment prevents ready entry of a circuit board into its connector and even more difficulty in their removal, sometimes requiring a large amount of force to be used leading to breakage of the circuit card itself. These alignment problems lead to high manufacturing costs. It is, therefore, advantageous to provide electronic hardware that eliminates the expense of sheetmetal assembly and particularly the alignment problems associated therewith and yet provide a simple, flexible, and economic arrangements for rigidly mounting circuit cards.

This invention provides improved hardware for filing printed circuit cards and which hardware is inexpensive, flexible, extremely reliable, and compatible with almost every data environment. The improved hardware comprises modular elements that may be snapped together for forming an assembly for receiving and storing a printed circuit card. The modular elements have been standardized to allow quantity production and the resulting low cost, and yet sufficiently flexible to be put together to any system configuration or modification thereof.

The electronic modular hardware includes a pair of printed circuit board guiding elements that are adapted to be mounted on holding elements and clamped thereto by a split-ring locking element. The guiding elements are provided with socket portions adjacent their opposite ends to hug a holding element such as a rod when clamped thereto. On the opposite side from the socket elements a guide slot or track is defined longitudinally thereof to slidably receive and hold a corresponding edge of a printed circuit card. The guiding elements are further defined with outwardly extending locking ears arranged transversely thereto to extend a predetermined distance along the holding element for coaction with a locking element. The locking elements are constructed in the form of a resilient plastic so that it may be slightly expanded to allow it to slip over the holding member and to receive and hug the locking ears arranged on opposite sides of a holding member to cause the guiding element to be snap-locked thereto when the locking element tends to assume its normal shape. The modular assembly or receptacle is completed by securing a conventional electrical circuit card connector to the pair of aligned guiding elements by means of a preformed aperture thereon whereby the socket for the electrical connector is always aligned with the slots or tracks for the guiding elements. This arrangement allows the circuit card to be easily slipped into the electrical connector by means of the guide slots and to be rigidly and accurately retained therein.

These modular elements may be further mounted on the holding members with the locking ears of a separately aligned pair of guiding elements arranged in a side-by-side alignment whereby a single locking element will function to snap-lock the locking ears of adjacent guiding elements to the holding members and which locking elements may be defined in various sizes to function as a spacer between successively stored cards. This arrangement may then be utilized as a separate modular assembly or be placed in a file drawer compatible with the other digital system hardware.

These and other features of the present invention may be more fully appreciated when considered in the light of the following specification and drawings, in which.

Figure 1:
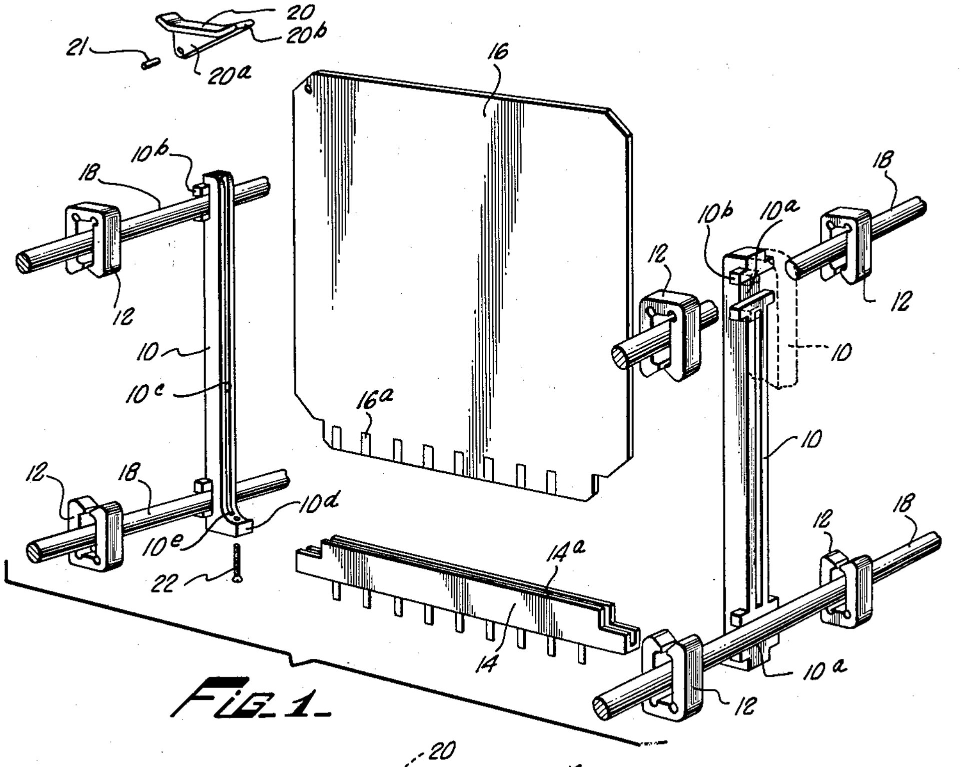
FIG. 1 is an exploded view of the modular elements arranged about holding elements and embodying the invention.

Referring now to the drawings, the structure for each of the modular elements allowing them to be snapped together to form a modular assembly or receptacle for storing and filing printed circuit boards will be described. Basically, the modular hardware comprises a guiding element 10, a locking element 12, and an electrical connector 14 for use with a printed circuit card or board 16. These modular elements are clamped or snapped to holding elements shown as the rods 18. In some applications it may be found convenient to provide the printed circuit card 16 with a handle or card puller 20.

To simplify the illustration of the invention and the corresponding description, the printed circuit card 16 and its associated electrical components are not illustrated except for the printed electrical conductors 16$^{a}$ adjacent the lower edge of the circuit board 16, as shown in FIG. 1. In this connection it should be understood that the electrical connector 14 is a conventional, commercially available connector and, for the purposes of this invention, it merely need be noted that it includes a socket portion 14a to receive the lower edge of the record card 16 whereby the printed circuit portions 16a will be aligned with the respective electrical terminals for the connector 14.

The guiding elements 10 comprise an elongate element constructed of a resilient plastic, such as nylon, and which may be formed by means of an injection molding process. The guiding elements 10 are formed with holding sockets adjacent their opposite ends, similar to the socket 10a defined to receive and hug a holding element or rod 18. The guiding elements 10 are further defined with locking elements or ears similar to the ear 10b arranged on opposite sides of the socket 10a and extending outwardly of the guiding element 10 proper to be coextensive with the holding element 18 for a preselected distance. The illustrated locking ears 10b are substantially rectangular in cross-section and extend outwardly from the opposite sides of the guiding element 10 in a transverse relationship and the ears on the same side of a socket are arranged to abut the opposite sides of the holding element 18. To this end, the holding socket 10a is defined of a depth whereby it merely hugs only one-half of the diameter of the holding element 18 in the form of a rod, and, therefore, the ears 10b mounted on the same side of the rod, as best seen in FIG. 1. For purposes that will be more evident hereinafter, the side or face of the guiding elements 10 are flat throughout its length.

The opposite face of the guiding element 10 from the face provided with the sockets 10a is provided with a longitudinal slot or track 10c extending substantially the entire length thereof, as best seen by viewing the guiding element 10 on the left hand side of FIG. 1. The guiding slot or track 10c is defined of a depth to slidably receive the circuit board 16 along its corresponding edge and to securely hold it in this position. One end of each guiding element 10 is constructed to have a transverse projection 10d having an aperture 10e thereon arranged relative to the guiding slots 10c to cause the electrical connector 14 and thereby the receptacle 14a to always be aligned therewith when the two are fastened together.

The locking elements 12 are shown in the form of a split ring. The locking elements 12 may also be constructed of a resilient plastic, such as nylon, and injection molded in various widths. The open ends of the locking element 12 are tapered to allow the locking element 12 proper to be slightly expanded as it is slipped over a holding element 18 and the locking ears 12b for a guiding element 10 placed thereon. The resilience of the locking element 12 is such that it firmly grips the locking ears 12b and, in tending to assume its normal shape, tightly hugs the ears and thereby snap-locks the guiding element 10 in a rigid relationship with the holding element 18. The width of the locking elements 12 are to be approximately equal to twice the length of a locking ear 10b.

The handle or card puller 20 may also be a molded plastic element and the type shown in FIG. 1 is defined with a bifurcated portion 20a with the fingers thereof spaced apart to be mounted on opposite faces of the printed circuit board 16. The card handle 20 is further provided with an upstanding portion 20b for gripping purposes. The handle may be secured to a corner of the printed circuit card 16 by means of a pin 21 to allow the handle to be pivoted thereabout.

With the above structure in mind, the assembly of the modular components will now be described. The assembly of two card guides 10 and an electrical connector 14 can be mounted as a rigid sub-assembly or a three-sided frame that can be easily moved or grouped with any number of similar frames at any desired spacing. A sub-assembly may be produced by mounting the projection 10d of the guiding elements 10 and the electrical connector 14 adjacent an end thereof with the guide tracks 10c facing inwardly thereof. These two units may then be fastened together by means of a screw, such as the screw 22 shown in FIG. 1, located in the aperture 10e. This arrangement causes the receptacle 14a to be in alignment with the guide tracks 10c. In the same fashion, a guiding element 10 is fastened to the opposite end of the connector 14 with its guide track 10c facing and in alignment with the guide track of the first-mentioned guide element 10. This sub-assembly may then be placed on holding elements mounted in proper relationship to receive the sockets 10a for the guide elements.

Figure 2:
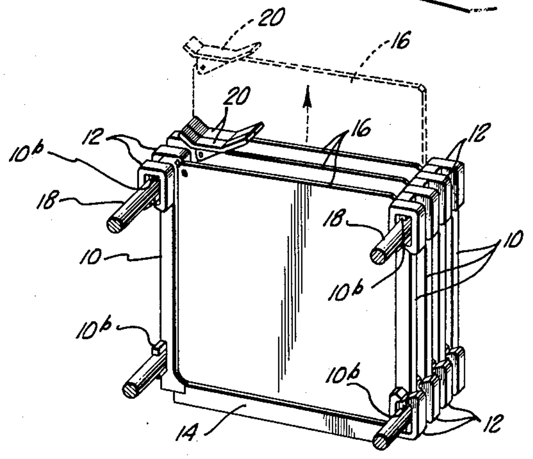
FIG. 2 is a perspective view of a portion of a modular sub-assembly employing the modular elements of FIG. 1 and showing a circuit card in a partially ejected relationship in dotted outline.

It will be assumed that the holding elements 18 are properly supported in parallel planes, as shown in FIG. 2. For example, the top pair of holding elements 18 are arranged in the same plane and spaced apart a distance corresponding to the width of the circuit card 16. In the same fashion, the bottom pair of holding elements 18 are supported in a plane parallel to the top pair and spaced downwardly therefrom a distance corresponding to the length of the circuit card 16. These latter holding elements are spaced apart from each other the same distance as the first pair.

The locking elements 12 may then be secured to the holding elements 18 by slipping them over these elements around the locking ears 10b and allowing them to snap into position for holding the guiding elements 10 in their selected position on the holding elements 18. The locking element 12 may be arranged on opposite sides of the guiding element 10 to securely hold them in the selected position. It will now be evident that the circuit card 16 may be slipped into the connector 14 by first inserting the card into the guide slots 10c adjacent the upper ends of the guiding elements 10 and forced down into the guides until the card 16 is locked into the socket 14a.

If the circuit card 16 that is stored in the above-described fashion is provided with a handle 20, it may be simply ejected without the use of a large amount of force or distributing the forces to the supporting structure for the holding elements 18. The handle 20 is grasped at the gripping portion 20b and is raised upwardly to cause the other end thereof normally overlying the adjacent portion of the guiding element 10 to transmit the lifting force down through this element and thereby to the connector 14 to cause it to release the card 16 with a minimum of force. Furthermore, when the holding elements 18 are mounted in a frame, no forces are transmitted to the frame proper.

When a plurality of circuit boards 16 are to be assembled by means of such a sub-assembly or three-sided frame, they may be further arranged to allow the circuit boards to be assembled in side-by-side fashion. For an assembly of this type the locking elements 12 further function as a spacer between adjacent guiding elements 10. The guiding elements 10 are arranged on the holding members 18 with the locking ears 10b arranged adjacent one another whereby a locking element 12 will be slipped over the ears 10b for both guiding elements 10 for locking both of them in position. The spacing between the adjacent guide elements 10 can be controlled by varying the width of the locking elements 12. The locking elements 12 therefore are defined to abut against the adjacent walls of the guiding elements 10 to space them apart in this fashion. This simple method of snap-locking the modular elements together may be continued with other sub-assemblies whereby the entire holding element 18 is defined as a compartment for retaining a plurality of circuit boards 16.

In addition, it should be noted that the holding elements 18 may be arranged to form compartments in a side-by-side relationship. For example, in the arrangement of FIG. 2 an additional holding member 18 may be placed to the right and/or to the left of the members shown therein. Assuming an element is arranged to the right of the holding elements 18 of FIG. 2, the assembly for this additional file merely requires that an additional sub-assembly be snapped to the pair of holding members 18 shown in the drawing but arranged with the flat face of a guide element 10 abutting the flat face of the locked guide element 10, that is, the socket portions $10^a$ will face one another and, when mounted on the holding members 18 of the type illustrated, will grip opposite halves of the member; as partially shown in dotted outline at the right hand side of FIG. 1. Since the locking ears $10^b$ are also arranged on one side of the holding member 18, it is possible for a locking element 12 to grasp and hug the ears $10^b$ for the two such mounted guiding elements 10 and thereby secure them in the desired relationship. The adjacent filing compartment is completed by the clamping of the remaining guide element 10 to the additional holding member to form a unit that is sufficiently rigid without the use of a fourth holding member 18. Various other components may be arranged in the same fashion.

Figure 3:
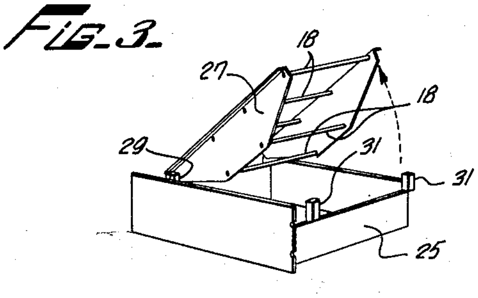
FIG. 3 is a perspective view of a typical file drawer for storing the sub-assemblies of the type of FIG. 2 and including a swingable filing unit.

Now referring to FIG. 3 wherein a drawer-type unit is shown for storing the sub-assemblies described will be examined. The drawer-like cabinet comprises a substantially rectangular frame 25 that may be mounted in a panel in a conventional fashion. The file includes a filing unit comprising holding elements 18 mounted on supporting plates 27. It will be recognized that the holding elements 18 are the same as the elements shown in FIGS. 1 and 2 and described hereinabove. The modular hardware elements may therefore be assembled in this type of drawer structure when such a storage assembly is required. For this purpose it should further be noted that the supporting plates 27 are arranged with hinge means at point 29 to allow the entire structure to be swingable in and out of the frame proper. The free end of the plates 27 are supported on the pair of feet 31 arranged at the opposite end of the frame 25 to maintain it at a level position when it is completely within the file drawer. It will be recognized that the swingable action of the filing unit allows ready access to the electrical components that are filed by means of the modular hardware.

It should now be evident that the present invention has advanced the state of the art through the provision of modular hardware that may be snap-locked together for forming sub-assemblies to store circuit boards and the like and which sub-assemblies require a minimum of space for storing large numbers of cards.

What is claimed is:

1. Hardware for mounting circuit boards and the like comprising a pair of holding elements arranged in substantially the same plane and spaced apart a distance corresponding to a preselected dimension of a circuit board, another pair of holding elements arranged in a spaced apart relationship in substantially the same plane and spaced from said first-mentioned pair a distance corresponding to another preselected dimension of the circuit board whereby the circuit board may be removably mounted between said pairs of elements, a pair of circuit board guiding elements each adapted to be mounted on and longitudinally extend between a preselected pair of the holding elements and having a longitudinal track defined on one side thereof to receive and secure a circuit board therein, said guiding elements being aligned in the same plane on the holding elements and arranged with the track opening toward each other to slidably receive the corresponding edges of a circuit board, each of said guiding elements having socket portions adjacent their ends to receive and hug a holding element when clamped thereto, separate means for clamping each of said guiding elements to one of the holding elements, and an electrical connector secured adjacent one end of each guiding element and aligned therewith to slidably receive and retain a circuit board inserted therein from the opposite end.

2. Hardware for mounting circuit boards and the like as defined in claim 1 wherein said holding elements are mounted to a pair of supporting plates arranged at opposite ends thereof to form a circuit board filing unit, a drawer type rectangular frame for mounting and supporting the thus defined circuit board retaining unit, and hinge means for mounting said filing unit to said frame and connected thereto at the ends of a different one of the supporting plates to allow the unit to be tilted out of the frame to thereby allow ready access to a stored circuit board.

3. Hardware for mounting circuit boards and the like as defined in claim 1 wherein said guiding elements each include locking elements defined adjacent each of said socket portions to extend outwardly of the guide elements from opposite sides thereof, and said clamping means are split-ring constructed and defined to slip over a holding element and receive the locking elements on the opposite sides of the holding elements to snap lock the guiding elements to their holding elements by means of said locking elements.

4. Hardware for mounting and filing printed circuit cards comprising a pair of holding rods arranged in substantially the same plane and spaced apart a distance corresponding to a preselected dimension of a circuit card, another pair of holding rods spaced apart in the same plane the same distance as said first-mentioned pair but in a plane parallel to said first-mentioned plane and spaced therefrom a distance corresponding to another preselected dimension of the circuit card, a supporting bracket mounting the opposite ends of each of said holding rods to define a rigid unit, at least a pair of circuit card guiding elements each adapted to be mounted between a preselected pair of holding rods and having a longitudinal slot defined on one side thereof to slidably receive and secure a circuit card therein, said guiding elements being mounted on the respective holding rods in a plane transverse to said parallel planes and with the card receiving slots opening toward each other to allow a circuit card to be slidably mounted between said elements, each of said guiding elements being provided with sockets adjacent the ends thereof and defined to receive and hug a holding rod when positioned thereon, said guiding elements each further including locking ears defined on opposite sides of said sockets and extending outwardly from the opposite sides of the guiding elements in a transverse relationship to the face provided with the sockets to be coextensive with the holding rod for a preselected distance at least a single resilient locking element of a split-ring configuration adapted to be slightly expanded and thereby slipped over a holding rod to receive and hug the locking ears arranged on opposite sides of the holding rod and the same side of a guiding element to cause the guiding element to be snap-locked to the holding rod when the locking element tends to assume its normal shape about a locking ear, an electrical connector for each pair of aligned guiding elements having a receptacle to slidably receive and secure a circuit card, and means for securing one end of the electrical connector to one end of a guiding element for each aligned pair whereby the connector receptacle is arranged in the same plane as card receiving slots to allow cards to be readily slipped into and out of the connector receptacle and in correct electrical engagement.

5. Hardware for mounting and filing printed circuit cards as defined in claim 4 wherein a plurality of said guiding elements are mounted on the holding rods with the locking ears in a side-by-side relationship and the locking elements defined to at least snap-lock the locking ears of adjacent guide elements to their holding rods and further functioning as spacers between the successive guiding elements.

6. Hardware for mounting and filing printed circuit cards as defined in claim 4 wherein the guiding elements are further defined with a flat face on the side provided with the sockets and including at least an additional holding rod mounted on the supporting bracket in one of said parallel planes and spaced therefrom a distance corresponding to the same preselected dimension of another circuit card to be mounted and stored by means of the additional rod and at least another pair of aligned guiding elements separately mounted on the additional rod and the adjacent pair of rods, the guiding elements mounted on said adjacent pair of rods are defined to be arranged in abutting relationship with one another with their corresponding flat faces and thereby socket portions facing each other and enclosing opposite sides of the holding rods, the same locking element for the adjacent guiding element further functioning to lock the additional guiding element, a similar locking element for snap-locking the other guide element to said additional holding rod and a separate electrical connector secured to the thus mounted additional pair of guiding elements.

7. Hardware for mounting printed circuit cards as defined in claim 4 wherein the circuit cards include a pivotable handle mounted adjacent one corner, said handle being defined to overlie the guiding element in a substantially flat relationship when the circuit card is secured in the connector and having an upstanding gripping portion that when gripped at said portion causes the force for ejecting the card from the electrical connector to be transmitted through the mounting hardware and thereby readily freeing the card.

8. Modular hardware for mounting circuit boards and the like comprising an elongate element having a pair of mounting sockets formed on one side thereof adjacent its ends and adapted to receive and partially hug a mounting member when clamped thereto, said element including locking elements defined adjacent said sockets to extend outwardly of the element in a plane transverse to the plane of the element to be coextensive with a mounting member snapped into the socket and provided with a circuit board track on the side opposite from said one side defined to extend longitudinally thereof and to slidably receive and secure the edge of a circuit board.

9. Hardware for mounting circuit boards and the like as defined in claim 8 wherein said one side has a flat face and the sockets thereof are of a depth to allow a similar element to be positioned to the same mounting member with their corresponding flat faces mounted in abutting relationship and hugging the opposite side of the mounting member.

10. Modular hardware for mounting circuit boards and the like comprising a pair of circuit board guiding elements each having a longitudinal track defined on one side thereof to slidably receive and secure a circuit board therein, each of said guiding elements having socket portions adjacent their ends to receive and hug a holding element when clamped thereto, said guiding elements further including a protrusion adjacent one end arranged on the same side thereof as said tracks and provided with an aperture spaced in alignment with the track and an electrical connector secured at opposite ends to the protrusion for each of said guiding elements by means of the aperture thereon with the tracks of the guiding elements opening toward each other to slidably receive and retain a circuit board inserted therein and thereby into electrical engagement with the connector.

References Cited in the file of this patent

UNITED STATES PATENTS

| | | |
|---|---|---|
| 1,077,638 | Petsche | Nov. 4, 1913 |
| 1,345,401 | Ratner | July 6, 1920 |
| 1,480,439 | Hand | Jan. 15, 1924 |
| 1,815,858 | Lifschultz | July 21, 1931 |
| 1,953,552 | Dequeker | Apr. 3, 1934 |
| 2,140,879 | O'Neal | Dec. 20, 1938 |
| 2,326,029 | Grunt | Aug. 3, 1943 |
| 2,390,309 | Keys | Dec. 4, 1945 |
| 2,976,510 | Blain | Mar. 21, 1961 |

UNITED STATES PATENT OFFICE

CERTIFICATE OF CORRECTION

Patent No. 3,017,232 January 16, 1962

Helmut Schwab et al.

It is hereby certified that error appears in the above numbered patent requiring correction and that the said Letters Patent should read as corrected below.

Column 6, line 50, after "distance" insert a comma.

Signed and sealed this 12th day of June 1962.

(SEAL)
Attest:

ERNEST W. SWIDER
Attesting Officer

DAVID L. LADD
Commissioner of Patents